(12) United States Patent
Katoh et al.

(10) Patent No.: US 10,908,338 B2
(45) Date of Patent: Feb. 2, 2021

(54) OPTICAL FILM, POLARIZING PLATE, AND IMAGE DISPLAY DEVICE

(71) Applicant: FUJIFILM Corporation, Tokyo (JP)

(72) Inventors: Shunya Katoh, Kanagawa (JP); Koji Iijima, Kanagawa (JP); Mitsuyoshi Ichihashi, Kanagawa (JP); Masaru Yoshikawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 114 days.

(21) Appl. No.: 16/266,889

(22) Filed: Feb. 4, 2019

(65) Prior Publication Data

US 2019/0170922 A1   Jun. 6, 2019

Related U.S. Application Data

(63) Continuation of application No. PCT/JP2017/028864, filed on Aug. 9, 2017.

(30) Foreign Application Priority Data

Aug. 12, 2016   (JP) ................. 2016-158419

(51) Int. Cl.
*G02B 5/30* (2006.01)
*C08F 2/44* (2006.01)
(Continued)

(52) U.S. Cl.
CPC .............. *G02B 5/3025* (2013.01); *C08F 2/44* (2013.01); *C08J 7/18* (2013.01); *C09D 133/14* (2013.01);
(Continued)

(58) Field of Classification Search
CPC ....... G02B 5/3025; G02B 5/3016; G09F 9/30; H01L 51/5281; G02F 1/1337;
(Continued)

(56) References Cited

U.S. PATENT DOCUMENTS

2006/0127603 A1   6/2006   Kim et al.
2006/0139754 A1   6/2006   Bacon, Jr. et al.
(Continued)

FOREIGN PATENT DOCUMENTS

CN   105074516 A   11/2015
JP   2003-002927 A   1/2003
(Continued)

OTHER PUBLICATIONS

Office Action, issued by the Japanese Patent Office on Jan. 14, 2020, in connection with corresponding Japanese Patent Application No. 2018-533527.
(Continued)

*Primary Examiner* — Ruiyun Zhang
(74) *Attorney, Agent, or Firm* — Edwards Neils LLC; Jean C. Edwards, Esq.

(57) ABSTRACT

The present invention provides an optical film exhibiting high alignment and good phase difference development in an oblique direction, and a polarizing plate and an image display device using the same. This optical film of the present invention has a substrate; and a phase difference layer which is provided on the substrate to be adjacent to the substrate, in which the phase difference layer is a layer formed by fixing vertical alignment of a liquid crystal compound having a polymerizable group included in a liquid crystal composition containing the liquid crystal compound and a polymer compound, a difference in δa value between the polymer compound and the substrate, which is calculated using three-dimensional SP values, is 3 or less, and a content of the polymer compound is less than 10 parts by mass with respect to 100 parts by mass of the liquid crystal compound.

18 Claims, 1 Drawing Sheet

(51) Int. Cl.
| | |
|---|---|
| *G02F 1/13363* | (2006.01) |
| *C09K 19/40* | (2006.01) |
| *C09D 133/14* | (2006.01) |
| *H01L 51/52* | (2006.01) |
| *C08J 7/18* | (2006.01) |
| *C09K 19/34* | (2006.01) |
| *G09F 9/30* | (2006.01) |
| *C09K 19/00* | (2006.01) |
| *G02F 1/1335* | (2006.01) |
| *G02F 1/1337* | (2006.01) |
| *C08F 226/10* | (2006.01) |
| *C08F 220/06* | (2006.01) |
| *C08F 220/30* | (2006.01) |
| *C08F 222/10* | (2006.01) |

(52) U.S. Cl.
CPC .......... *C09K 19/00* (2013.01); *C09K 19/3444* (2013.01); *C09K 19/404* (2013.01); *G02F 1/1337* (2013.01); *G02F 1/13363* (2013.01); *G02F 1/133528* (2013.01); *G09F 9/30* (2013.01); *H01L 51/5281* (2013.01); *C08F 220/06* (2013.01); *C08F 220/303* (2020.02); *C08F 222/1025* (2020.02); *C08F 222/1035* (2020.02); *C08F 222/1045* (2020.02); *C08F 226/10* (2013.01); *C08J 2301/12* (2013.01); *C08J 2345/00* (2013.01); *C08J 2433/14* (2013.01); *C08J 2467/07* (2013.01); *C09K 2323/00* (2020.08); *C09K 2323/03* (2020.08); *G02B 5/3008* (2013.01); *G02B 5/3016* (2013.01); *G02F 2001/133742* (2013.01); *G02F 2001/133746* (2013.01)

(58) Field of Classification Search
CPC ... G02F 1/133528; G02F 2001/133746; G02F 2001/133742; C09K 19/00; C09K 2323/00; C09K 2323/03; Y10T 428/10; Y10T 428/1036

USPC .... 428/1.1, 1.3, 1.33; 349/99, 117, 118, 163
See application file for complete search history.

(56) References Cited

U.S. PATENT DOCUMENTS

| | | |
|---|---|---|
| 2008/0316418 A1 | 12/2008 | Harding et al. |
| 2012/0133882 A1 | 5/2012 | Aizono et al. |
| 2013/0083394 A1 | 4/2013 | Takeda et al. |
| 2015/0022764 A1 | 1/2015 | Takeda et al. |
| 2015/0277006 A1 | 10/2015 | Takasago et al. |
| 2016/0109757 A1 | 4/2016 | Ibaraki |
| 2016/0152896 A1 | 6/2016 | Kwon et al. |

FOREIGN PATENT DOCUMENTS

| | | |
|---|---|---|
| JP | 2007-206205 A | 8/2007 |
| JP | 2008-523443 A | 7/2008 |
| JP | 2008-525856 | 7/2008 |
| JP | 2008-191250 A | 8/2008 |
| JP | 2008-545856 A | 12/2008 |
| JP | 2011-059663 A | 3/2011 |
| JP | 2013-083953 A | 5/2013 |
| JP | 2013-235232 A | 11/2013 |
| JP | 2016-053709 A | 4/2016 |
| JP | 2016-080942 A | 5/2016 |
| JP | 2016-110143 A | 6/2016 |

OTHER PUBLICATIONS

International Search Report issued in PCT/JP2017/028864 dated Sep. 26, 2017.
Written Opinion issued in PCT/JP2017/028864 dated Sep. 26, 2017.
International Preliminary Report on Patentability completed by WIPO dated Feb. 12, 2019 in connection with International Patent Application No. PCT/JP2017/028864.
Office Action issued by State Intellectual Property Office of People's Republic of China dated Aug. 27, 2020 in connection with corresponding Chinese Patent Application No. 201780048224.1.

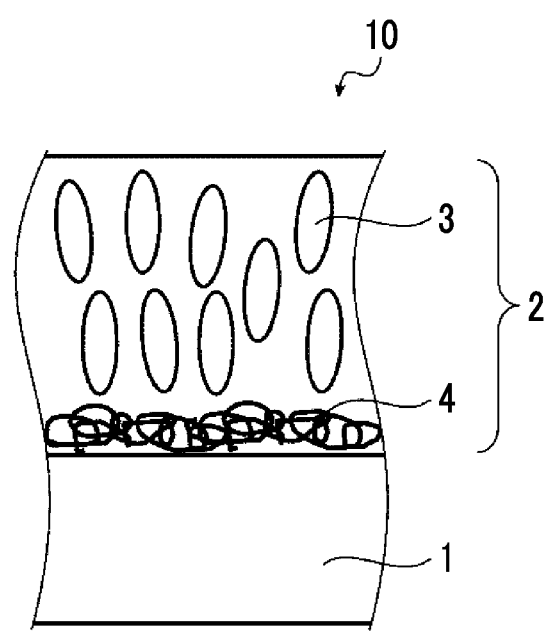

OPTICAL FILM, POLARIZING PLATE, AND IMAGE DISPLAY DEVICE

CROSS-REFERENCE TO RELATED APPLICATIONS

This application is a Continuation of PCT International Application No. PCT/JP2017/028864 filed on Aug. 9, 2017 which was published under PCT Article 21(2) in Japanese, and claims priority under 35 U.S.C. § 119(a) to Japanese Patent Application No. 2016-158419 filed on Aug. 12, 2016. The above applications are hereby expressly incorporated by reference, in their entirety, into the present application.

BACKGROUND OF THE INVENTION

1. Field of the Invention

The present invention relates to an optical film, a polarizing plate, and an image display device.

2. Description of the Related Art

A phase difference film is generally used for a liquid crystal display device.

As a method of producing a phase difference film, it is known that a phase difference layer is formed after an alignment film (interlayer) is formed on a substrate by an alignment treatment.

For example, JP2013-235232A discloses a phase difference film having at least a support, an interlayer, and a phase difference layer in this order, in which the support is a predetermined cellulose acylate film, the interlayer contains a polyvinyl alcohol resin or an acrylic resin having a polar group, and the phase difference layer is a layer in which the homeotropic alignment state of a liquid crystal compound is fixed.

On the other hand, JP2008-523443A discloses, as a homeotropic alignment liquid crystal film which does not require an alignment film, a homeotropic alignment liquid crystal film produced by a method of producing a homeotropic alignment liquid crystal film including a step of directly coating a plastic substrate having a surface subjected to a hydrophilic treatment with a polymerizable and reactive liquid crystal mixture solution including a surfactant ([claim 1] and [claim 10]).

SUMMARY OF THE INVENTION

The present inventors have conducted investigations on the films disclosed in JP2013-235232A and JP2008-523443A and have found that, in a case where the production process is simplified by omitting an operation of forming an alignment film and an operation of applying a hydrophilic treatment, there is a problem that the alignment state in the phase difference layer is disordered or a problem that the development of the phase difference in the oblique direction becomes insufficient.

An object of the present invention is to provide an optical film exhibiting high alignment and good phase difference development in an oblique direction even in a case where the production process is simplified, and a polarizing plate and an image display device using the same.

As a result of intensive investigations to achieve the above object, the present inventors have found that by mixing a specific amount of a polymer compound satisfying the relationship of a predetermined SP value in relation to a substrate with a liquid crystal composition before the alignment state of a liquid crystal compound is fixed, even in a case where the production process is simplified, high alignment is exhibited and the phase difference development in an oblique direction is improved, and thus have completed the present invention.

That is, it has been found that the above object can be achieved by adopting the following configurations.

[1] An optical film comprising: a substrate; and a phase difference layer which is provided on the substrate to be adjacent to the substrate, in which the phase difference layer is a layer formed by fixing vertical alignment of a liquid crystal compound having a polymerizable group included in a liquid crystal composition containing the liquid crystal compound and a polymer compound, a difference in δa value between the polymer compound and the substrate, which is calculated using three-dimensional SP values, is 3 or less, and a content of the polymer compound is less than 10 parts by mass with respect to 100 parts by mass of the liquid crystal compound.

[2] The optical film according to [1], in which an amount of the polymer compound present on a surface of the phase difference layer close to the substrate is larger than an amount of the polymer compound present on a surface of the phase difference layer opposite to the substrate.

[3] The optical film according to [1] or [2], in which the polymer compound has a hydrophilic group.

[4] The optical film according to any one of [1] to [3], in which the polymer compound does not have a fluorine atom.

[5] The optical film according to any one of [1] to [4], in which the polymer compound has a hydrophilic group, and the liquid crystal composition contains an onium salt compound.

[6] The optical film according to any one of [1] to [5], in which the polymer compound has a hydrophilic group, and the liquid crystal composition contains a boronic acid compound.

[7] The optical film according to any one of [1] to [6], in which a δa value of the substrate, which is calculated using three-dimensional SP values, is 10 or more.

[8] The optical film according to any one of [1] to [7], in which a δa value of the polymer compound, which is calculated using three-dimensional SP values, is 15 to 19.

[9] The optical film according to any one of [1] to [8], in which the polymer compound has a mesogen group represented by Formula (M), -L-X-(A-Y)$_n$—Z     (M)

here, L represents a linking group having 1 to 8 carbon atoms; X and Y each independently represent a single bond, —O—, —C(O)O—, —OC(O)—, —OC(O)O—, —C(O)OCH$_2$CH$_2$—, or —CH$_2$CH$_2$C(O)O—; A represents a 1,4-phenylene group, a 2,6-naphthylene group, or a 1,4-trans-cyclohexylene group which may have a substituent; Z represents a hydrogen atom, an alkyl group having 1 to 8 carbon atoms, an alkenyl group having 1 to 8 carbon atoms, a halogen atom, a cyano group, or -L$^1$-P, where L$^1$ represents a linking group having 1 to 8 carbon atoms, and P represents a polymerizable group; n represents an integer of 2 to 5; and in a case where n is an integer of 2 or greater, a plurality of A's may be the same or different from each other; and a plurality of Y's may be the same or different from each other.

[10] The optical film according to any one of [1] to [9], in which the polymer compound is a polymer having a repeating unit represented by Formula (I),

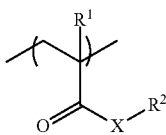

(I)

in Formula (I), $R^1$ represents a hydrogen atom or a methyl group; X represents —O— or —NH—; and $R^2$ represents a hydrogen atom or an organic group.

[11] The optical film according to any one of [1] to [10], in which a δa value of the substrate, which is calculated using three-dimensional SP values, is 10 or more, and the polymer compound is a polymer having a repeating unit having a δa value of 13 or more and less than 18, the δa value being calculated using three-dimensional SP values.

[12] The optical film according to any one of [1] to [10], in which a δa value of the substrate, which is calculated using three-dimensional SP values, is 5 or more and less than 10, and the polymer compound is a polymer having a repeating unit having a δa value of 5 or more and less than 11, the δa value being calculated using three-dimensional SP values.

[13] A polarizing plate comprising: the optical film according to any one of [1] to [12].

[14] The polarizing plate according to [13], further comprising: a polarizer.

[15] An image display device comprising: the optical film according to any one of [1] to [12]; or the polarizing plate according to [13] or [14].

According to the present invention, it is possible to provide an optical film exhibiting high alignment and good phase difference development in an oblique direction even in a case where the production process is simplified, and a polarizing plate and an image display device using the same.

BRIEF DESCRIPTION OF THE DRAWING

FIG. 1 is a schematic cross-sectional view for illustrating an estimation mechanism in an optical film according to the present invention.

DESCRIPTION OF THE PREFERRED EMBODIMENTS

Hereinafter, the present invention will be described in detail.

The description of the constitutional requirements described below is made on the basis of representative embodiments of the present invention, but it should not be construed that the present invention is limited to those embodiments.

In this specification, numerical value ranges expressed by the term "to" mean that the numerical values described before and after "to" are included as a lower limit and an upper limit, respectively.

[Optical Film]

An optical film according to an embodiment of the present invention is an optical film having a substrate and a phase difference layer which is provided on the substrate to be adjacent to the substrate.

In addition, in the optical film according to the embodiment of the present invention, the phase difference layer is a layer formed by fixing vertical alignment of a liquid crystal compound having a polymerizable group included in a liquid crystal composition containing the liquid crystal compound and a polymer compound, Further, in the in the optical film according to the embodiment of the present invention, a difference in δa value between the polymer compound and the substrate, which is calculated using three-dimensional SP values, is 3 or less.

Further, in the in the optical film according to the embodiment of the present invention, a content of the polymer compound is less than 10 parts by mass with respect to 100 parts by mass of the liquid crystal compound.

<δa Value>

In the present specification, the δa value means an anti-dispersion force component of an SP value which can be calculated by Hoy's method (referred to "PROPERTIES OF POLYMERS (ED. 3)", written by VAN KREVELEN, D. W., published from ELSEVIER (1990)).

That is, the δa value can be calculated using three-dimensional SP values (δd, δp, and δh) calculated by Hoy's method by Formula (X).

$$\delta a = (\delta p^2 + \delta h^2)^{0.5}$$  Formula (X)

According to the Hoy's method, respective values of δd, δp, and δh can be calculated based on the chemical structural formula of a compound to be obtained.

In a case of a copolymer constituted of a plurality of repeating units, the δa value of the copolymer can be obtained by substituting square values of three-dimensional SP values, (δd², δp², and δh²) of the copolymer, which are respectively the sum of the product of a square value (δd², δp², and δh²) of a three-dimensional SP value of each repeating unit and a volume ratio of each repeating unit, in Formula (X).

In the present invention, as described above, by mixing the polymer compound in which a difference in δa value between the polymer compound and the substrate is within 3 with the liquid crystal composition before the alignment state of the liquid crystal compound is fixed at a ratio of less than 10 parts by mass with respect to 100 parts by mass of the liquid crystal compound, even in a case where the production process is simplified, high alignment is exhibited and phase difference development in an oblique direction is improved.

Although the reason is not clear in detail, the present inventors assume as follows.

First, FIG. 1 shows a schematic cross-sectional view for illustrating an estimation mechanism in an optical film according to an embodiment of the present invention.

An optical film 10 shown in FIG. 1 has a substrate 1, and a phase difference layer 2 which is provided on the substrate to be adjacent to the substrate, the phase difference layer 2 contains a liquid crystal compound 3 whose alignment state is fixed and a polymer compound 4. In FIG. 1, formally, an embodiment in which the phase difference layer 2 contains the liquid crystal compound 3 is shown, but in the related art, after the alignment state of the liquid crystal compound is fixed and the phase difference layer is formed, the liquid crystal compound does not need to exhibit liquid crystallinity.

The present inventors assume that in a case where a difference in δa value between the polymer compound 4 and the substrate 1 is 3 or less, and the content of the polymer compound 4 is less than 10 parts by mass with respect to 100 parts by mass of the liquid crystal compound 3, as shown in FIG. 1, the polymer compound 4 is easily localized near the interface with the substrate 1, thus, the liquid crystal compound 3 is not easily aligned in a horizontal direction, and as a result, alignment in a vertical direction is promoted.

Hereinafter, various members used for the optical film according to the embodiment of the present invention will be described in detail.

[Substrate]

The substrate of the optical film according to the embodiment of the present invention is a substrate for supporting the phase difference layer which will be described later, and is, for example, in a case where the phase difference layer is formed by applying a liquid crystal composition which will be described later, a substrate to which the liquid crystal composition is applied.

Such a substrate is preferably transparent and specifically, the substrate preferably has a light transmittance of 80% or more. The term "transparent" that the visible light transmittance is 60% or more.

Examples of such a support include glass substrates and polymer films.

Examples of the material for the polymer film include cellulose-based polymers such as triacetyl cellulose (TAC), diacetyl cellulose, and cellulose acetate propionate; acrylic polymers such as polymethacrylic acid ester, and polyacrylic acid ester; polycarbonate-based polymers; polyester-based polymers such as polyethylene terephthalate and polyethylene naphthalate; styrene-based polymers such as polystyrene and an acrylonitrile-styrene copolymer (AS resin); polyolefin-based polymers such as polyethylene, polypropylene, and an ethylene-propylene copolymer; polymers having an alicyclic structure such as a norbornene-based polymer, a polymer of monocyclic cyclic olefin, a polymer of cyclic conjugated diene, and a vinyl alicyclic hydrocarbon polymer; vinyl chloride-based polymers; amide-based polymers such as nylon, and aromatic polyamide; imide-based polymers; sulfone-based polymers; polyether sulfone-based polymers; polyether ether ketone-based polymers; polyphenylene sulfide-based polymers; vinylidene chloride-based polymers; vinyl alcohol-based polymers; vinyl butyral-based polymers; arylate-based polymers; polyoxymethylene-based polymers; epoxy-based polymers; and polymers containing a mixture of these polymers.

Among these materials, cellulosic polymers or polymers having an alicyclic structure are preferable.

In the present invention, for the reason that the effect of improving the alignment by the present invention is increased, the δa value of the substrate is preferably 10 or more and more preferably 13 to 19.

In the present invention, although the thickness of the substrate is not particularly limited, the thickness is preferably 5 to 60 μm and more preferably 5 to 30 μm.

In the present invention, as long as a difference in δa value between a polarizer which will be described later and the polymer compound which will be described later is 3 or less, the polarizer may serve as the substrate.

[Phase Difference Layer]

The phase difference layer of the optical film according to the embodiment of the present invention is a layer formed by fixing vertical alignment of a liquid crystal compound having a polymerizable group included in a liquid crystal composition containing the liquid crystal compound and a polymer compound (hereinafter, formally also referred to as "liquid crystal composition of the present invention").

Here, the vertical alignment in a case where the liquid crystal compound is a rod-like liquid crystal compound refers to homeotropic alignment and means alignment in which an angle formed between the surface of the above-described substrate and the director of the rod-like liquid crystal compound is within a range of 70° to 90°. The alignment in which the angle is within a range of 80° to 90° is preferable, and the alignment in which the angle is within a range of 85° to 90° is more preferable.

In addition, the vertical alignment in a case where the liquid crystal compound is a disk-like liquid crystal compound means alignment in which an angle formed between the surface of the above-described substrate and the plane of the disk of the disk-like liquid crystal compound is within a range of 70° to 90°. The alignment in which the angle is within a range of 80° to 90° is preferable, and the alignment in which the angle is within a range of 85° to 90° is more preferable.

<Liquid Crystal Compound>

The liquid crystal compound contained in the liquid crystal composition of the present invention is not particularly limited as long as the liquid crystal compound has a polymerizable group, and a conventionally known liquid crystal compound can be used.

Here, specific examples of the polymerizable group include an acryloyl group, a methacryloyl group, a vinyl group, a styryl group, and an allyl group. Among these, an acryloyl group or a methacryloyl group is preferable.

Generally, liquid crystal compounds are classified into a rod-like type and a disk-like type according to the shape thereof. Further, each includes a low molecular type and a high molecular type. The term "high molecular" generally refers to a compound having a degree of polymerization of 100 or more (Polymer Physics-Phase Transition Dynamics, by Masao Doi, p. 2, published by Iwanami Shoten, Publishers, 1992).

In the present invention, any type of liquid crystal compound can be used, but a rod-like liquid crystal compound or a disk-like liquid crystal compound (discotic liquid crystal compound) is preferably used. Two or more kinds of rod-like liquid crystal compounds, two or more kinds of disk-like liquid crystal compounds, or a mixture of a rod-like liquid crystal compound and a disk-like liquid crystal compound may be used.

In addition, from the viewpoint of fixing the alignment, the liquid crystal compound preferably has two or more polymerizable groups described above. In the case of a mixture of two or more kinds of liquid crystal compounds, at least one kind of liquid crystal compound preferably has two or more polymerizable groups in one molecule.

As the rod-like liquid crystal compound, for example, the rod-like liquid crystal compounds described in claim 1 of JP1999-513019A (JP-H11-513019A) or paragraphs [0026] to [0098] of JP2005-289980A can be preferably used, and, as the discotic liquid crystal compounds, for example, the discotic liquid crystal compounds described in paragraphs [0020] to [0067] of JP2007-108732A and paragraphs [0013] to [0108] of JP2010-244038A can be preferably used, but the liquid crystal compounds are not limited thereto.

In the present invention, it is preferable to use a rod-like liquid crystal compound as the liquid crystal compound, and for example, azomethines, azoxys, cyanobiphenyls, cyanophenyl esters, benzoic acid esters, cyclohexanecarboxylic acid phenyl esters, cyanophenylcyclohexanes, cyano-substituted phenylpyrimidines, alkoxy-substituted phenylpyrimidines, phenyl dioxanes, tolans, and alkenylcyclohexyl benzonitriles may be preferably used.

<Polymer Compound>

The polymer compound contained in the liquid crystal composition of the present invention is a polymer having δa value having a difference of 3 or less with the δa value of the above-described substrate (which refers to the absolute value of difference. The same applies hereinafter).

In the present invention, from the reason for making the polymer compound uniformly present at the interface of the above-described substrate and improving the surface state of the phase difference layer, the polymer compound is preferably a polymer having a δa value with a difference of 0.1 to 2.0 with the δa value of the substrate, more preferably a polymer having a δa value with a difference of 0.2 to 1.5 with the δa value of the substrate, and even more preferably a polymer having a δa value with a difference of 0.3 to 1.0 with the δa value of the substrate.

In addition, in the present invention, for the reason that the effect of improving the alignment by the present invention is increased, the polymer compound is preferably a polymer having a δa value of 15 to 19 and more preferably a polymer having a δa value of 16 to 19.

The main chain skeleton of such a polymer compound is not particularly limited and for the reason that the molecular design of the side chain varies and the main chain formation by addition polymerization is convenient, a polymer having a repeating unit represented by Formula (I) is preferable and a copolymer having two or more kinds of repeating units which are different from each other and represented by Formula (I) is more preferable.

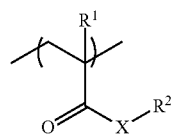
(I)

Here, in Formula (I), $R^1$ represents a hydrogen atom or a methyl group, X represents —O— or —NH—, and $R^2$ represents a hydrogen atom or an organic group.

In the present invention, from the viewpoint of further improving the alignment, the polymer compound preferably has a hydrophilic group.

Here, for example, as the hydrophilic group, one or more selected from the group consisting of a hydroxy group (—OH), a carboxy group (—COOH), an amino group (—NH$_2$), a sulfo group (—SO$_3$H), a sulfate group (—OSO$_3$H), a phosphonoxy group {—OP(=O)(OH)$_2$}, and salts thereof may be used and among these, a hydroxy group and a carboxy group are preferable.

In addition, the polymer compound may have two or more kinds of hydrophilic groups.

As the polymer compound having the hydrophilic group, a polymer or copolymer which has the repeating unit represented by Formula (I) and in which the hydrophilic group is included in the organic group represented by $R^2$ in Formula (I), or a polymer or copolymer which has the repeating unit represented by Formula (I) and in which X represents an oxygen atom (—O—) and $R^2$ represents a hydrogen atom in Formula (I) is suitably used.

In the present invention, in a case where the hydrophilic group is included in the repeating unit represented by Formula (I), the content of the repeating unit including the hydrophilic group is preferably 3 to 50 mol % and more preferably 5 to 30 mol % with respect to the total repeating units represented by Formula (I).

In addition, in the case where the hydrophilic group is included in the repeating unit represented by Formula (I), the δa value of the repeating unit including the hydrophilic group is preferably 13 to 25 and more preferably 17 to 21.

In the present invention, from the viewpoint of further improving the alignment, it is preferable that the polymer compound does not have a fluorine atom.

As such a polymer compound, a polymer or copolymer having the repeating unit represented by Formula (I) and not having a fluorine atom in the organic group represented by $R^2$ in Formula (I) is suitably used.

Further, in the present invention, for the reason that the effect of improving the alignment by the present invention is increased, the polymer compound preferably has a mesogen group represented by Formula (M).

As such a polymer compound, a polymer or copolymer which has the repeating unit represented by Formula (I) and in which the organic group represented by $R^2$ in Formula (I) is the mesogen group represented by Formula (M) is suitably used.

-L-X-(A-Y)$_n$—Z     (M)

In Formula (M), L represents a linking group having 1 to 8 carbon atoms; X and Y each independently represent a single bond, —O—, —C(O)O—, —OC(O)—, —OC(O)O—, —C(O)OCH$_2$CH$_2$—, or —CH$_2$CH$_2$C(O)O—; A represents a 1,4-phenylene group, a 2,6-naphthylene group, or a 1,4-transcyclohexylene group which may have a substituent; Z represents a hydrogen atom, an alkyl group having 1 to 8 carbon atoms, an alkenyl group having 1 to 8 carbon atoms, a halogen atom, a cyano group, or -L$^1$-P, where L$^1$ represents a linking group having 1 to 8 carbon atoms, and P represents a polymerizable group; n represents an integer of 2 to 5; and in a case where n is an integer of 2 or greater, a plurality of A's may be the same or different from each other; and a plurality of Y's may be the same or different from each other.

Examples of the linking group having 1 to 8 carbon atoms represented by L in Formula (M) include a linear or branched alkylene group having 1 to 8 carbon atoms, and specific examples thereof include a methylene group, an ethylene group, a propylene group, a butylene group, a pentylene group, a hexylene group, and an octylene group. Among these, an alkylene group having 2 to 6 carbon atoms is preferable.

In Formula (M), Z is preferably an alkyl group having 1 to 8 carbon atoms, and specific suitable examples thereof include a methyl group, an ethyl group, a propyl group, an isopropyl group, an n-butyl group, an isobutyl group, a sec-butyl group, a tert-butyl group, an n-pentyl group, and an n-hexyl group. Among these, an alkyl group having 1 to 3 carbon atoms is preferable and an ethyl group is more preferable.

In the present invention, in a case where the organic group represented by $R^2$ in Formula (I) is the mesogen group represented by Formula (M), the content of the repeating unit including the mesogen group is preferably 3 to 30 mol % and more preferably 5 to 20 mol % with respect to the total repeating unit represented by Formula (I).

In addition, in the case where the organic group represented by $R^2$ in Formula (I) is the mesogen group represented by Formula (M), the δa value of the repeating unit including the mesogen group is preferably 11 to 16 and more preferably 12 to 14.

In the present invention, in a case where the δa value of the above-described substrate is 10 or more and is particularly 13 to 19, for the reason that the effect of improving the alignment by the present invention is increased, the polymer compound is preferably a polymer having a repeating unit in which the δa value, which is calculated using three-dimensional SP values, is 13 or more and less than 18.

Examples of a monomer constituting such a repeating unit include methyl methacrylate (δa=13.8), methoxyethyl acrylate (δa=13.7), 2-acetoacetoxyethyl methacrylate (δa=15.2), and tetrahydrofurfuryl acrylate (δa=13.2). These may be used alone or in combination of two or more kinds thereof. The δa value in the parenthesis together with the monomer is the δa value of the repeating unit constituted of the monomer.

In addition, the content of the repeating unit constituted of these monomers is preferably 30 to 100 mol % and more preferably 50 to 80 mol % with respect to the total repeating units represented by Formula (I).

In the present invention, in a case where the δa value of the above-described substrate is 5 or more and less than 10 and is particularly 7 or more and less than 10, for the reason that the effect of improving the alignment by the present invention is increased, the polymer compound is preferably a polymer having a repeating unit in which the δa value, which is calculated using three-dimensional SP values, is 5 or more and less than 11.

Examples of a monomer constituting such a repeating unit include octadecyl acrylate (δa=6.3), lauryl acrylate (δa=7.4), cyclohexyl acrylate (δa=10.2), dicyclopentanyl acrylate (δa=9.6), and isobornyl acrylate (δa=10.4). These may be used alone or in combination of two or more kinds thereof. The δa value in the parenthesis together with the monomer is the δa value of the repeating unit constituted of the monomer.

In addition, the content of the repeating unit constituted of these monomers is preferably 30 to 95 mol % and more preferably 50 to 85 mol % with respect to the total repeating units represented by Formula (I).

Examples of the polymer compound having the repeating unit represented by Formula (I) include polymer compounds represented by Formulae A101 to A108, A111 to A119, A201 to A209, and A301 to A307.

In the following description, the polymer compound represented by Formula A101 is denoted as "polymer compound A101". In addition, the polymer compounds represented by Formulae A102 to A108, A111 to A119, A201 to A209, and A301 to A307 are denoted in the same manner.

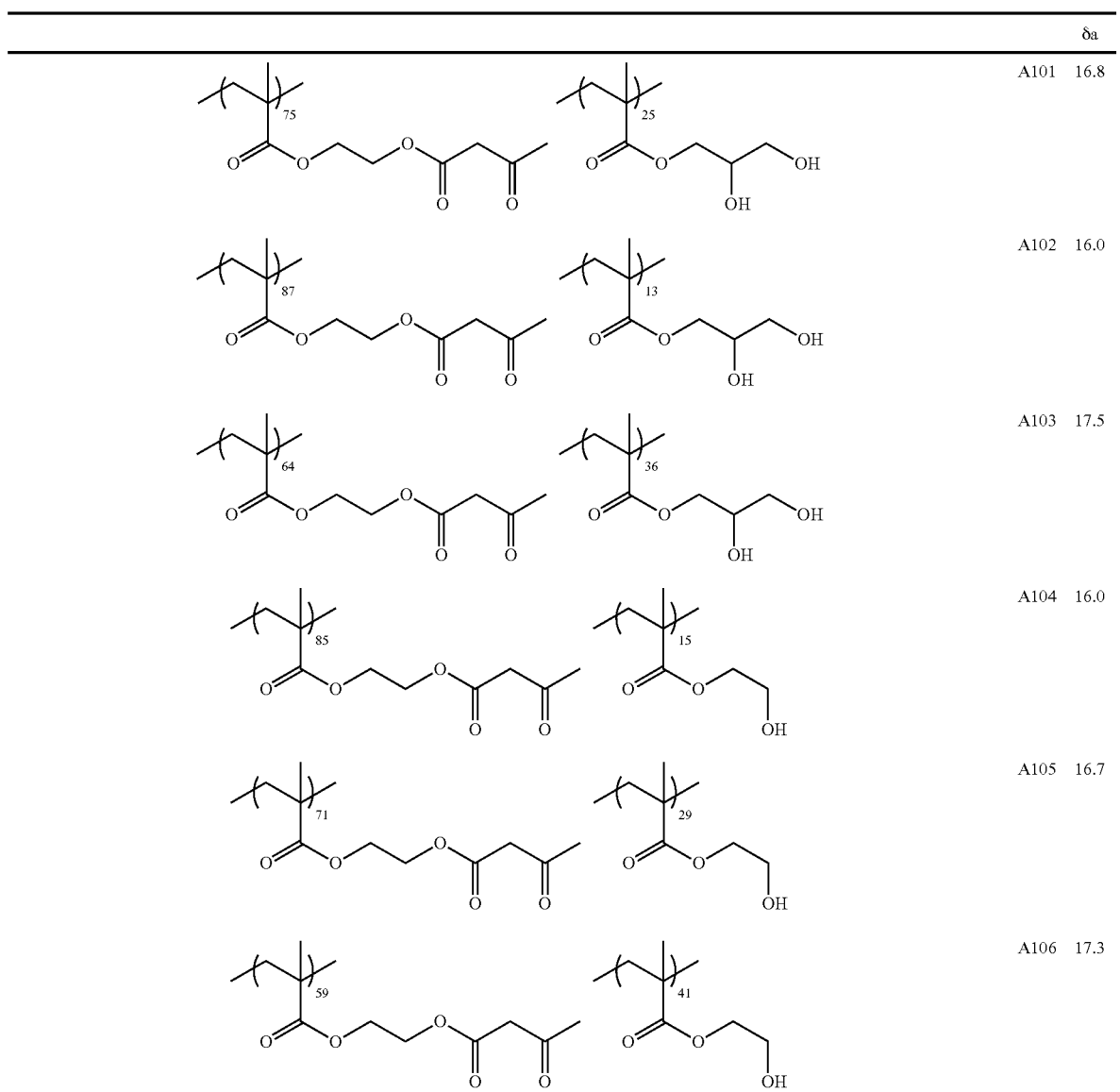

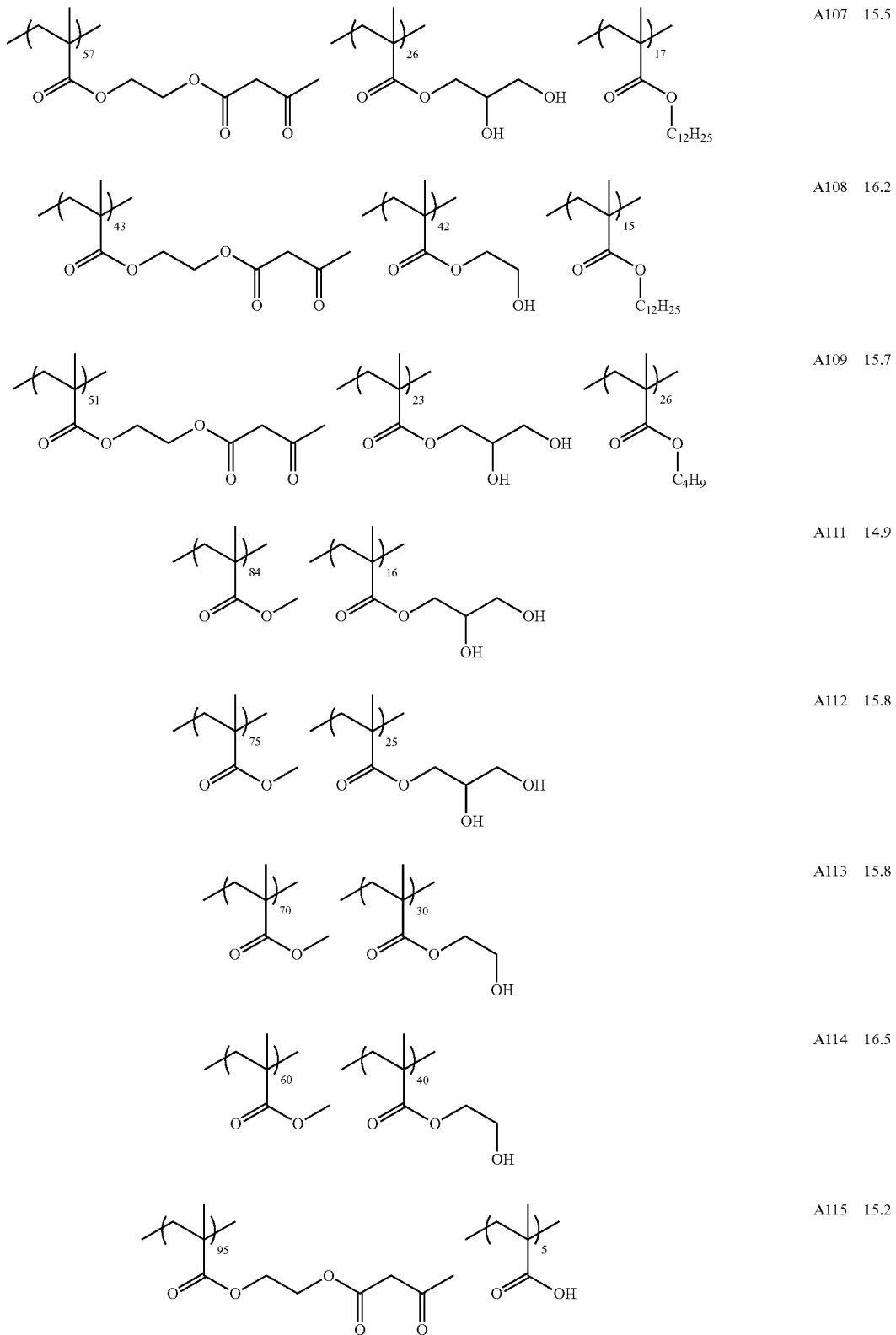

-continued

|  | δa |
|---|---|
| A116 | 15.1 |
| A117 | 15.6 |
| A118 | 17.2 |
| A119 | 15.3 |
| A201 | 17.4 |
| A202 | 17.5 |
| A203 | 16.0 |
| A204 | 16.8 |
| A205 | 16.8 |
| A206 | 15.5 |

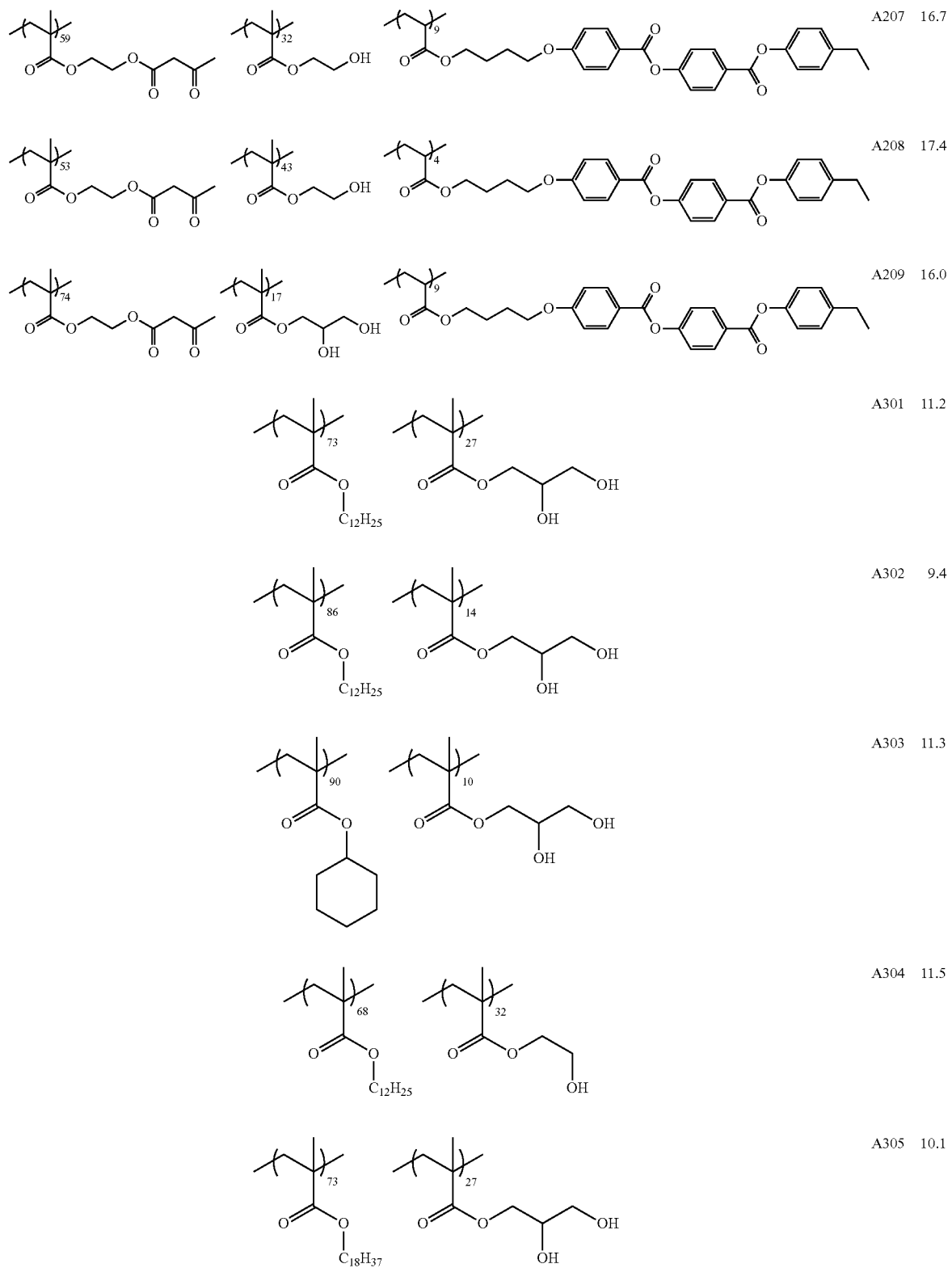

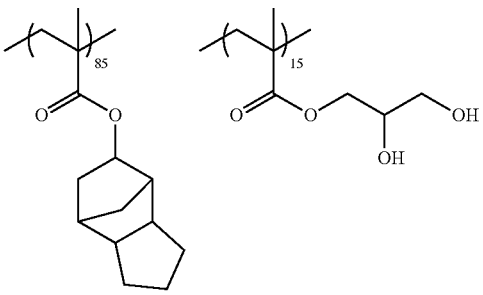

A306 11.4

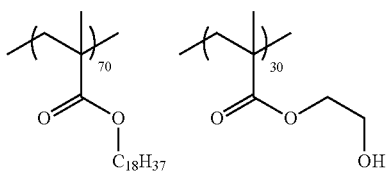

A307 10.5

The weight-average molecular weight of such a polymer compound is not particularly limited and is preferably 1000 to 500000, more preferably 2000 to 100000, and even more preferably 3000 to 50000.

Here, the weight-average molecular weight of the polymer compound is defined as a value in terms of polystyrene measured by gel permeation chromatography (GPC). The weight-average molecular weight of the polymer compound can be obtained by, for example, using HLC-8120 (manufactured by Tosoh Corporation), and using TSK gel Multipore HXL-M (manufactured by Tosoh Corporation, 7.8 mm ID×30.0 cm) as a column, and tetrahydrofuran (THF) or N-methylpyrrolidone (NMP) as an eluent.

In the present invention, the content of the polymer compound is less than 10 parts by mass with respect to 100 parts by mass of the above-described liquid crystal compound, preferably 0.5 parts by mass or more and less than 10 parts by mass, more preferably 1 to 8 parts by mass, and even more preferably 1 to 5 parts by mass.

In the present invention, for the reason that the alignment is further improved, it is preferable that the amount of the polymer compound present on the surface of the phase difference layer close to the substrate (the interface close to the substrate) is larger than the amount of the polymer compound on the surface of the phase difference layer opposite to the substrate, and specifically, it is preferable that the amount of the polymer compound present in a region at a thickness of 0.2 μm from the surface of the phase difference layer close to the substrate (the interface close to the substrate) is larger than the amount of the polymer compound present in a region at a thickness of 0.2 μm from the surface of the phase difference layer opposite to the substrate.

<Onium Salt Compound>

For the reason that the alignment is further improved, the liquid crystal composition of the present invention preferably contains an onium salt compound in a case where the above-described polymer compound has a hydrophilic group.

As the onium salt compound, a known onium salt compound as a vertical alignment agent can be used. Specific examples thereof include compounds described in paragraphs [0042] to [0052] of JP2016-105127A.

In a case where the liquid crystal composition contains the onium salt compound, the content of the onium salt compound is preferably 0.5 to 5 parts by mass and more preferably 1 to 3 parts by mass with respect to 100 parts by mass of the above-described liquid crystal compound.

<Boronic Acid Compound>

For the reason that the alignment is further improved, the liquid crystal composition of the present invention preferably contains a boronic acid compound in a case where the above-described polymer compound has a hydrophilic group.

As the boronic acid compound, a known onium salt compound as a vertical alignment agent can be used. Specific examples thereof include compounds described in paragraphs [0053] to [0054] of JP2016-105127A.

In a case where the liquid crystal composition contains the boronic acid compound, the content of the boronic acid compound is preferably 0.1 to 5 parts by mass and more preferably 0.5 to 3 parts by mass with respect to 100 parts by mass of the above-described liquid crystal compound.

<Polymerization Initiator>

The liquid crystal composition of the present invention preferably contains a polymerization initiator.

The polymerization initiator to be used is preferably a photopolymerization initiator capable of initiating a polymerization reaction by irradiation with ultraviolet rays.

Examples of the photopolymerization initiator include α-carbonyl compounds (described in U.S. Pat. Nos. 2,367,661A and 2,367,670A), acyloin ethers (described in U.S. Pat. No. 2,448,828A), α-hydrocarbon-substituted aromatic acyloin compounds (described in U.S. Pat. No. 2,722,512A), multinuclear quinone compounds (as described in U.S. Pat. Nos. 3,046,127A and 2,951,758A), combinations of triarylimidazole dimer and p-aminophenyl ketone (as described in U.S. Pat. No. 3,549,367A), acridine and phenazine compounds (described in JP1985-105667A (JP-S60-105667A) and U.S. Pat. No. 4,239,850A), oxadiazole compounds (described in U.S. Pat. No. 4,212,970A), and acyl phosphine oxide compounds (described in JP1988-040799B (JP-S63-040799B), JP1993-029234B (JP-H05-029234B), JP1998-095788A (JP-H10-095788A), and JP1998-029997A (JP-H10-029997A)).

<Polymerizable Monomer>

The liquid crystal composition of the present invention may include a polymerizable monomer from the viewpoint of uniformity of the coating film and strength of the phase difference layer.

Examples of the polymerizable monomer include radically polymerizable or cationically polymerizable compound. Preferable is a polyfunctional radically polymerizable monomer and a monomer copolymerizable with a disk-like liquid crystal compound containing the polymerizable group is more preferable. Examples thereof include those described in paragraphs [0018] to [0020] of JP2002-296423A.

The amount of the polymerizable monomer to be added is preferably 1% to 50% by mass and more preferably 5% to 30% by mass with respect to the disk-like liquid crystal compound.

<Surfactant>

The liquid crystal composition of the present invention may include a surfactant from the viewpoint of uniformity of the coating film and strength of the phase difference layer.

As the surfactant, a conventionally known compound is exemplified and particularly, a fluorine-based compound is preferable. Specific examples thereof include compounds described in paragraphs [0028] to [0056] of JP2001-330725A, and compounds described in paragraphs [0069] to [0126] of JP2003-295212A.

<Solvent>

The liquid crystal composition of the present invention preferably contains a solvent from the viewpoint of workability to form the phase difference layer.

Specific examples of the solvent include ketones (for example, acetone, 2-butanone, methyl isobutyl ketone, cyclohexanone, and cyclopentanone), ethers (for example, dioxane, and tetrahydrofuran), aliphatic hydrocarbons (for example, hexane), alicyclic hydrocarbons (for example, cyclohexane), aromatic hydrocarbons (for example, toluene, xylene, and trimethylbenzene), halogenated carbons (for example, dichloromethane, dichloroethane, dichlorobenzene, and chlorotoluene), esters (for example, methyl acetate, ethyl acetate, and butyl acetate), water, alcohols (for example, ethanol, isopropanol, butanol, and cyclohexanol), Cellosolves (for example, methyl cellosolve, and ethyl cellosolve), cellosolve acetates, sulfoxides (for example, dimethylsulfoxide), and amides (for example, dimethylformamide, and dimethylacetamide), and these solvents may be used alone or in combination of two or more kinds thereof.

[Method of Forming Phase Difference Layer]

In the present invention, as the method of forming the phase difference layer, for example, a method in which the above-described liquid crystal composition is applied to the above-described substrate to attain a desired alignment state and then the alignment state is fixed by polymerization may be used.

Examples of the method of applying the liquid crystal composition include a wire bar coating method, an extrusion coating method, a direct gravure coating method, a reverse gravure coating method, and a die coating method.

The polymerization conditions are not particularly limited, but in polymerization by photoirradiation, ultraviolet rays are preferably used. The irradiation dose is preferably 10 mJ/cm$^2$ to 50 J/cm$^2$, more preferably 20 mJ/cm$^2$ to 5 J/cm$^2$, even more preferably 30 mJ/cm$^2$ to 3 J/cm$^2$, and particularly preferably 50 to 1000 mJ/cm$^2$. In addition, in order to promote a polymerization reaction, polymerization may be performed under heating conditions.

The thickness of the phase difference layer of the optical film according to the embodiment of the present invention is not particularly limited and is preferably 0.1 to 10 μm and more preferably 0.5 to 5 μm.

[Polarizing Plate]

A polarizing plate according to an embodiment of the present invention is a polarizing plate having the above-described optical film according to the embodiment of the present invention.

In addition, in a case where the above-described substrate does not have a function of a polarizer, the polarizing plate according to the embodiment of the present invention has a polarizer.

[Polarizer]

The polarizer of the polarizing plate according to the embodiment of the present invention is not particularly limited as long as the polarizer is a member having a function of converting light into specific linearly polarized light, and conventionally known absorptive type polarizer and reflective type polarizer can be used.

An iodine-based polarizer, a dye-based polarizer using a dichroic dye, a polyene-based polarizer, and the like are used as the absorptive type polarizer. The iodine-based polarizer and the dye-based polarizer are a coating type polarizer and a stretching type polarizer, any one of these polarizers can be applied. However, a polarizer which is prepared by allowing polyvinyl alcohol to adsorb iodine or a dichroic dye and performing stretching is preferable.

In addition, examples of a method of obtaining a polarizer by performing stretching and dyeing in a state of a laminated film in which a polyvinyl alcohol layer is formed on a substrate include methods disclosed in JP5048120B, JP5143918B, JP4691205B, JP4751481B, and JP4751486B, and known technologies related to these polarizers can be preferably used.

A polarizer in which thin films having different birefringence are laminated, a wire grid type polarizer, a polarizer in which a cholesteric liquid crystal having a selective reflection range and a ¼ wavelength plate are combined, and the like are used as the reflective type polarizer.

Among these, from the viewpoint of further improving adhesiveness, a polarizer containing a polyvinyl alcohol-based resin (a polymer including —CH$_2$—CHOH— as a repeating unit, in particular, at least one selected from the group consisting of polyvinyl alcohol and an ethylene-vinyl alcohol copolymer) is preferable.

In the present invention, although the thickness of the polarizer is not particularly limited, the thickness thereof is preferably 3 μm to 60 μm, more preferably 5 μm to 30 μm, and even more preferably 5 μm to 15 μm.

[Pressure Sensitive Adhesive Layer]

The polarizing plate of the present invention may have a pressure sensitive adhesive layer arranged between the phase difference layer in the optical film according to the embodiment of the present invention and the polarizer.

The pressure sensitive adhesive layer used for lamination of the phase difference layer and the polarizer is, for example, a substance in which a ratio between storage elastic modulus G' and loss elastic modulus G" (tan δ=G"/G') is 0.001 to 1.5, where G' and G" are measured with a dynamic viscoelastometer. Such a substance includes a so-called pressure sensitive adhesive or readily creepable substance. As the pressure sensitive adhesive that can be used in the present invention, for example, a polyvinyl alcohol-based pressure sensitive adhesive may be used, but there is no limitation thereto.

[Image Display Device]

An image display device according to an embodiment of the present invention is an image display device having the optical film according to the embodiment of the present invention or the polarizing plate according to the embodiment of the present invention.

The display element used for the image display device according to the embodiment of the present invention is not particularly limited and examples thereof include a liquid crystal cell, an organic electroluminescent (hereinafter, abbreviated as "EL") display panel, and a plasma display panel.

Among these, a liquid crystal cell and an organic EL display panel are preferable, and a liquid crystal cell is more preferable. That is, for the image display device according to the embodiment of the present invention, a liquid crystal display device using a liquid crystal cell as a display element, and an organic EL display device using an organic EL display panel as a display element are preferable and a liquid crystal display device is more preferable.

[Liquid Crystal Display Device]

A liquid crystal display device as an example of the image display device according to the embodiment of the present invention is a liquid crystal display device including the above-described polarizing plate according to the embodiment of the present invention and a liquid crystal cell.

In the present invention, it is preferable that the polarizing plate of the present invention is used for the polarizing plate of the front side, out of the polarizing plates provided on the both sides of the liquid crystal cell, and it is more preferable that the polarizing plate of the present invention is used for the polarizing plates on the front and rear sides.

Hereinafter, the liquid crystal cell constituting the liquid crystal display device will be described in detail.

<Liquid Crystal Cell>

The liquid crystal cell for use in the liquid crystal display device is preferably of a vertical alignment (VA) mode, an optically compensated bend (OCB) mode, an in-plane-switching (IPS) mode or a twisted nematic (TN) mode but the cell mode is not limited thereto.

In a TN mode liquid crystal cell, rod-like liquid crystal molecules are aligned substantially horizontally in a case in which no voltage is applied and are further aligned in a twisted manner in a range of 60° to 120°. The TN mode liquid crystal cell is most often used in a color TFT liquid crystal display device and is mentioned in many literatures.

In a VA mode liquid crystal cell, rod-like liquid crystal molecules are aligned substantially vertically in a case in which no voltage is applied. Examples of the VA mode liquid crystal cells include (1) a narrowly defined VA mode liquid crystal cell (described in JP1990-176625A (JP-H02-176625A)) in which rod-like liquid crystal molecules are aligned substantially vertically in a case in which no voltage is applied and are aligned substantially horizontally in a case in which a voltage is applied, (2) a multi-domain VA mode (MVA mode) liquid crystal cell for enlarging the viewing angle (SID97, Digest of Tech. Papers (Proceedings) 28 (1997) 845), (3) a liquid crystal cell in a mode (n-ASM mode) in which rod-like liquid crystal molecules are aligned substantially vertically in a case in which no voltage is applied and are aligned in twisted multi-domain alignment in a case in which a voltage is applied (Proceedings of Japanese Liquid Crystal Conference, 58 and 59 (1998)), and (4) a SURVIVAL mode liquid crystal cell (presented in LCD International 98). The liquid crystal cell may be of any of a patterned vertical alignment (PVA) type, an optical alignment type, and a polymer-sustained alignment (PSA) type. These modes are described in detail in JP2006-215326A and JP2008-538819A.

In an IPS mode liquid crystal cell, rod-like liquid crystal molecules are aligned substantially parallel with respect to a substrate and application of an electric field parallel to the substrate surface causes the liquid crystal molecules to respond planarly. The IPS mode displays black in a case in which no electric field is applied and a pair of upper and lower polarizing plates have absorption axes which are orthogonal to each other. A method of improving the viewing angle by reducing light leakage during black display in an oblique direction using an optical compensation sheet is described in JP1998-54982A (JP-H10-54982A), JP1999-202323A (JP-H11-202323A), JP1997-292522A (JP-H09-292522A), JP1999-133408A (JP-H11-133408A), JP1999-305217A (JP-H11-305217A), JP1998-307291A (JP-H10-307291A), and the like.

[Organic EL Display Device]

As the organic EL display device which is an example of the image display device of the present invention, for example, an embodiment which includes, from the visible side, the polarizing plate of the present invention, a plate having a λ/4 function (hereinafter referred to also as "λ/4 plate") and an organic EL display panel in this order is suitable.

The "plate having a λ/4 function" as used herein refers to a plate having a function of converting linearly polarized light at a specific wavelength into circularly polarized light (or circularly polarized light into linearly polarized light). Specific examples of an embodiment in which the λ/4 plate is of a single layer structure include a stretched polymer film, and a phase difference film in which an optically anisotropic film having a λ/4 function is provided on a support. A specific example of an embodiment in which the λ/4 plate is of a multilayer structure includes a broadband λ/4 plate in which the λ/4 plate and a λ/2 plate are laminated on each other.

The organic EL display panel is a display panel configured using an organic EL device in which an organic light emitting layer (organic electroluminescent layer) is sandwiched between electrodes (between a cathode and an anode). The configuration of the organic EL display panel is not particularly limited but any known configuration is adopted.

EXAMPLES

Hereinafter, the features of the present invention will be more specifically described using Examples and Comparative Examples. The materials, amounts used, ratios, treatment contents and treatment procedures shown in the examples below can be modified as appropriate in the range of not departing from the spirit of the present invention. Therefore, the scope of the present invention should not be construed as being limited to the following specific examples.

(1) Preparation of Cellulose Acylate Film

In the following manner, a cellulose acylate film was prepared.

(1-1) Preparation of Dope

Preparation of Cellulose Acylate Solution:

A cellulose acylate solution (concentration of solid contents: 22% by mass) constituted of cellulose triacetate (acetyl substitution degree: 2.81), polycondensed polyester shown in Table 1 (19 parts by mass with respect to 100 parts by mass of cellulose triacetate), a compound L2 below (5 parts by mass with respect to 100 parts by mass of cellulose triacetate), and a solvent (a mixture of methylene chloride and ethanol, mass ratio: 87:13) was put into a mixing tank and stirred to dissolve the respective components. The obtained solution was further heated at 90° C. for about 10 minutes and then filtered through a filter paper having an average pore diameter of 34 μm and a sintered metal filter having an average pore diameter of 10 μm.

TABLE 1

| Glycol unit | | | | Dicarboxylic acid unit | | | Number |
|---|---|---|---|---|---|---|---|
| Both terminal blocking ratio (mol %) | Ethylene glycol (mol %) | 1,2-Propanediol (mol %) | Average carbon number | Terephthalic acid (mol %) | Succinic acid (mol %) | Average carbon number | average molecular weight |
| 100 (acetyl group) | 50 | 50 | 2.5 | 55 | 45 | 6.2 | 1000 |

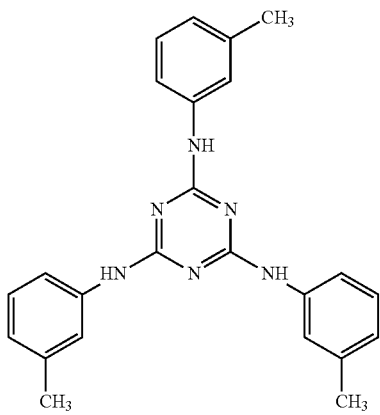

Preparation of Fine Particle Dispersion:

The following component including the prepared cellulose acylate solution was put into a disperser to prepare a fine particle dispersion.

| Fine particle dispersion | |
|---|---|
| Inorganic fine particles (AEROSIL (registered trademark) R972 manufactured by Nippon Aerosil Co., Ltd.) | 0.2 parts by mass |
| Methylene chloride | 72.4 parts by mass |
| Methanol | 10.8 parts by mass |
| Cellulose acylate solution | 10.3 parts by mass |

100 parts by mass of the cellulose acylate solution and the fine particle dispersion in such an amount that the amount of the inorganic fine particles was 0.02 parts by mass with respect to cellulose acylate were mixed to prepare a dope.

(1-2) Casting

The dope was cast using a band casting machine. The band was made of stainless steel.

(1-3) Drying

A web (film) obtained by casting was peeled off from the band, then transported by pass rolls, and dried at a drying temperature of 120° C. for 20 minutes. The drying temperature as used herein means a film surface temperature of the film.

(1-4) Stretching

The obtained web (film) was peeled off from the band, sandwiched between clips, and stretched in a direction (TD) orthogonal to the transporting direction (MD) of the film using a tenter at a stretching temperature of 189° C. and a stretching ratio of 70% under the condition of fixed-end uniaxial stretching. Thus, a cellulose acylate film (TAC 1) was obtained. The δa value of TAC 1 was 16.4.

(2) Cycloolefin Polymer Film

As a cycloolefin polymer film (COP 1), ARTON (registered trademark) manufactured by JSR Corporation was used. The δa value of COP 1 was 8.7.

Example 1

A liquid crystal composition 1 having the following composition was prepared.

| Preparation of Liquid Crystal Composition 1 | |
|---|---|
| Rod-like liquid crystal compound (M-1) below | 84 parts by mass |
| Rod-like liquid crystal compound (M-2) below | 15 parts by mass |
| Rod-like liquid crystal compound (M-3) below | 1 part by mass |
| Polymerizable monomer (M-4) below | 8 parts by mass |
| Polymerization initiator (Irgacure 907, manufactured by BASF SE) | 3 parts by mass |
| Sensitizer (KAYACURE DETX, manufactured by Nippon Kayaku Co., Ltd.) | 1 part by mass |
| Fluorine-based polymer (M-5) below | 0.4 parts by mass |
| Onium salt compound S01 below | 2 parts by mass |
| Boronic acid compound S2 below | 1 part by mass |
| Polymer compound A101 above | 2 parts by mass |
| Methyl ethyl ketone | 204 parts by mass |
| Cyclohexanone | 33 parts by mass |

Rod-Like Liquid Crystal Compound (M-1)

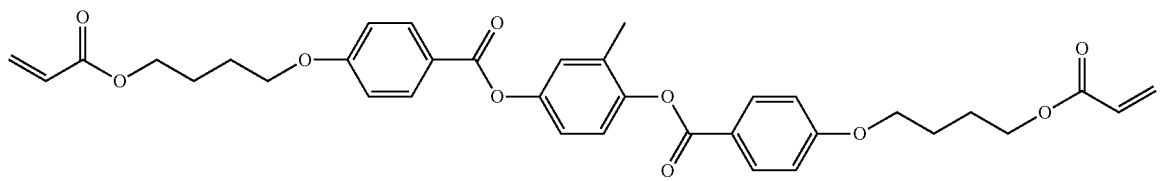 [SMILES: C=CC(=O)OCCCCOc1ccc(C(=O)Oc2ccc(OC(=O)c3ccc(OCCCCOC(=O)C=C)cc3)c(C)c2)cc1]

Rod-Like Liquid Crystal Compound (M-2)

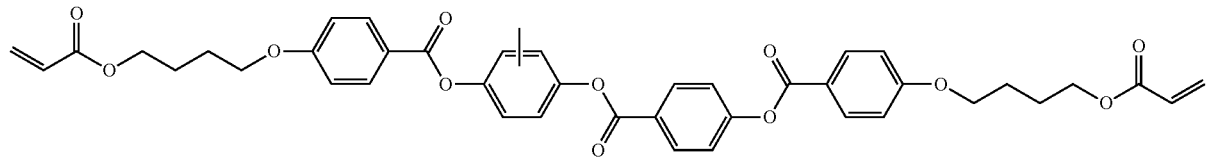

Rod-Like Liquid Crystal Compound (M-3)

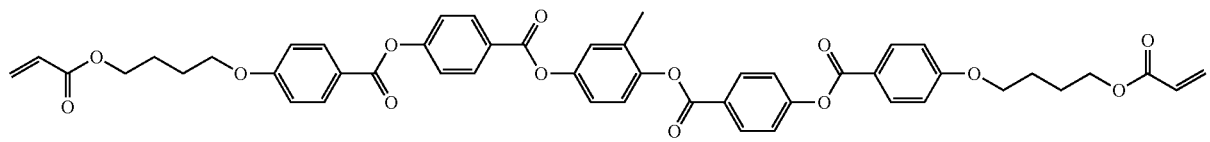

Polymerizable Monomer (M-4)

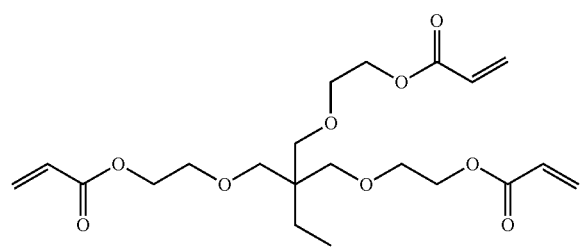 [SMILES: C=CC(=O)OCCOCC(CC)(COCCOC(=O)C=C)COCCOC(=O)C=C]

Fluorine-Based Polymer (M-5)

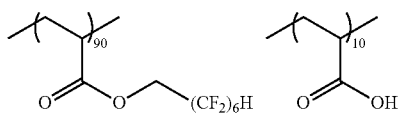

Onium Salt Compound S01

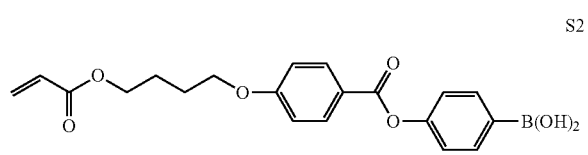 [SMILES: C=CC(=O)OCCCCOc1ccc(C(=O)Oc2ccc(B(O)O)cc2)cc1]

Boronic Acid Compound S2

The liquid crystal composition 1 was applied to the surface of the substrate (TAC 1) using a #3 wire bar.

The resulting coating was stuck to a metal frame and heated in a constant-temperature tank at 70° C. for 1 hour and the rod-like liquid crystal compound was vertically aligned (homeotropically aligned).

Next, the stack was cooled to 40° C. and then irradiated with an ultraviolet ray at an illuminance of 190 mW/cm² and an irradiation dose of 300 mJ/cm² using an air-cooled metal halide lamp of 160 W/cm (manufactured by Eye Graphics Co., Ltd.) under a nitrogen purge at an oxygen concentration of about 0.1% to cure the coated layer to cure the coating layer.

Then, the stack was allowed to cool to room temperature (23° C.) and a phase difference layer having a thickness of 1.3 μm was formed. Thus, an optical film was prepared.

The prepared optical film was analyzed by etching and time of flight secondary mass spectrometry (TOF-SIMS), and thus it was confirmed that almost all mount of the added polymer compound A101 was localized at the interface between TAC 1 as a substrate and the phase difference layer.

Examples 2 to 15

Optical films were prepared in the same manner as in Example 1 except that as the liquid crystal composition 1, composition in which the kind of polymer compound and the mixing amount thereof, and the mixing amounts of the onium salt compound S01 and the boronic acid compound S2 were changed to the kind and values shown in Table 2 was used.

Example 16

A liquid crystal composition 2 having the following composition was prepared.

| Preparation of Liquid Crystal Composition 2 | |
|---|---|
| Rod-like liquid crystal compound (M-1) above | 84 parts by mass |
| Rod-like liquid crystal compound (M-2) above | 15 parts by mass |
| Rod-like liquid crystal compound (M-3) above | 1 part by mass |
| Polymerizable monomer (M-4) above | 8 parts by mass |
| Polymerization initiator (Irgacure 907, manufactured by BASF SE) | 3 parts by mass |
| Sensitizer (KAYACURE DETX, manufactured by Nippon Kayaku Co., Ltd.) | 1 part by mass |
| Fluorine-based polymer (M-5) above | 0.4 parts by mass |

-continued

| Preparation of Liquid Crystal Composition 2 | |
|---|---|
| Polymer compound A201 above | 2 parts by mass |
| Methyl ethyl ketone | 199 parts by mass |
| Cyclohexanone | 32 parts by mass |

An optical film was prepared in the same manner as in Example 1 except that instead of using the liquid crystal composition 1, the liquid crystal composition 2 was used.

Examples 17 to 24

An optical film was prepared in the same manner as in Example 16 except that as the liquid crystal composition 2, a composition in which the kind of polymer compound was changed to the kind shown in Table 2 was used.

Example 25

A liquid crystal composition 3 having the following composition was prepared.

| Preparation of Liquid Crystal Composition 3 | |
|---|---|
| Rod-like liquid crystal compound (M-1) above | 84 parts by mass |
| Rod-like liquid crystal compound (M-2) above | 15 parts by mass |
| Rod-like liquid crystal compound (M-3) above | 1 part by mass |
| Polymerizable monomer (M-4) above | 8 parts by mass |
| Polymerization initiator (Irgacure 907, manufactured by BASF SE) | 3 parts by mass |
| Sensitizer (KAYACURE DETX, manufactured by Nippon Kayaku Co., Ltd.) | 1 part by mass |
| Fluorine-based polymer (M-5) above | 0.4 parts by mass |
| Onium salt compound S01 above | 2 parts by mass |
| Boronic acid compound S2 above | 1 part by mass |
| Polymer compound A301 above | 2 parts by mass |
| Methyl acetate | 190 parts by mass |
| Cyclohexanone | 37 parts by mass |

An optical film was prepared in the same manner as in Example 1 except that COP 1 was used instead of using TAC 1, and the liquid crystal composition 3 was used instead of using the liquid crystal composition 1.

Examples 26 to 31

Optical films were prepared in the same manner as in Example 25 except that as the liquid crystal composition 3, a composition in which the kind of polymer compound was changed to the kind shown in Table 2 was used.

Comparative Example 1

An optical film was prepared in the same manner as in Example 1 except that instead of using the liquid crystal composition 1, the liquid crystal composition 3 was used.

Comparative Example 2

An optical film was prepared in the same manner as in Example 1 except that instead of using TAC 1, COP 1 was used.

Comparative Examples 3 and 4

Optical films were prepared in the same manner as in Example 1 except that the mixing amount of the polymer compound was changed to the value shown in Table 2.

Comparative Example 5

An optical film was prepared in the same manner as in Example 26 except that the mixing amount of the polymer compound was changed to the value shown in Table 2.

[Evaluation]

(1) Alignment

A polarizing microscope was set under a crossed nicols condition, each of the prepared optical films was inserted into the stage, and the stage was rotated such that the slow axis of the substrate was parallel with the analyzer or polarizer of the polarizing microscope.

In this state, when each optical film was observed, an optical film in which a uniform dark field was observed for an area of 98% or more exhibited very excellent alignment and was evaluated as "S", an optical film in which a uniform dark field was observed for an area of 95% or more less than 98% exhibited excellent alignment and was evaluated as "A", an optical film in which a uniform dark field was observed for an area of 80% or more less than 95% exhibited slightly deteriorated alignment and was evaluated as "B", and an optical film in which a uniform dark field was observed for an area of less than 80% exhibited deteriorated alignment and was evaluated as "C". The results are shown in Table 2.

(2) Phase Difference in Oblique Direction

The retardation Rth(550) of each of the prepared optical films in the thickness direction at a wavelength of 550 nm was measured using AxoScan OPMF-1 (manufactured by Opto Science, Inc.). The results are shown in Table 2.

TABLE 2

| | Substrate | | Polymer Compound | | | Difference in δa value with substrate | S01*1 | S2*2 | | |
|---|---|---|---|---|---|---|---|---|---|---|
| | Kind | δa value | Kind | Parts by mass | δa value | | Parts by mass | Parts by mass | Alignment | Rth(550) |
| Example 1 | TAC1 | 16.4 | A101 | 2 | 16.8 | 0.4 | 2 | 1 | S | −132 nm |
| Example 2 | TAC1 | 16.4 | A101 | 2 | 16.8 | 0.4 | 1 | 0.5 | S | −131 nm |
| Example 3 | TAC1 | 16.4 | A101 | 2 | 16.8 | 0.4 | 2 | 0 | S | −129 nm |
| Example 4 | TAC1 | 16.4 | A102 | 4 | 16.0 | 0.4 | 2 | 1 | S | −130 nm |
| Example 5 | TAC1 | 16.4 | A103 | 2 | 17.5 | 1.1 | 2 | 1 | S | −131 nm |
| Example 6 | TAC1 | 16.4 | A104 | 2 | 16.0 | 0.4 | 2 | 1 | S | −131 nm |
| Example 7 | TAC1 | 16.4 | A105 | 2 | 16.7 | 0.3 | 2 | 1 | S | −129 nm |
| Example 8 | TAC1 | 16.4 | A106 | 2 | 17.3 | 0.9 | 2 | 1 | S | −132 nm |
| Example 9 | TAC1 | 16.4 | A107 | 2 | 15.5 | 0.9 | 2 | 1 | S | −129 nm |
| Example 10 | TAC1 | 16.4 | A108 | 2 | 16.2 | 0.2 | 2 | 1 | S | −129 nm |

TABLE 2-continued

| | Substrate | | Polymer Compound | | Difference in δa value with substrate | S01*1 Parts by mass | S2*2 Parts by mass | Alignment | Rth(550) |
|---|---|---|---|---|---|---|---|---|---|
| | Kind | δa value | Kind | Parts by mass | δa value | | | | |
| Example 11 | TAC1 | 16.4 | A109 | 3 | 15.7 | 0.7 | 2 | 1 | S | −128 nm |
| Example 12 | TAC1 | 16.4 | A113 | 2 | 15.8 | 0.6 | 2 | 1 | S | −128 nm |
| Example 13 | TAC1 | 16.4 | A115 | 2 | 15.2 | 1.2 | 2 | 1 | S | −128 nm |
| Example 14 | TAC1 | 16.4 | A116 | 2 | 15.1 | 1.3 | 2 | 1 | S | −130 nm |
| Example 15 | TAC1 | 16.4 | A117 | 2 | 15.6 | 0.8 | 2 | 1 | S | −129 nm |
| Example 16 | TAC1 | 16.4 | A201 | 2 | 17.4 | 1.0 | 0 | 0 | S | −132 nm |
| Example 17 | TAC1 | 16.4 | A202 | 2 | 17.5 | 1.1 | 0 | 0 | A | −126 nm |
| Example 18 | TAC1 | 16.4 | A203 | 2 | 16.0 | 0.4 | 0 | 0 | S | −132 nm |
| Example 19 | TAC1 | 16.4 | A204 | 2 | 16.8 | 0.4 | 0 | 0 | S | −128 nm |
| Example 20 | TAC1 | 16.4 | A205 | 2 | 16.8 | 0.4 | 0 | 0 | A | −126 nm |
| Example 21 | TAC1 | 16.4 | A206 | 2 | 15.5 | 0.9 | 0 | 0 | S | −129 nm |
| Example 22 | TAC1 | 16.4 | A207 | 2 | 16.7 | 0.3 | 0 | 0 | S | −131 nm |
| Example 23 | TAC1 | 16.4 | A208 | 2 | 17.4 | 1.0 | 0 | 0 | S | −131 nm |
| Example 24 | TAC1 | 16.4 | A209 | 2 | 16.0 | 0.4 | 0 | 0 | S | −132 nm |
| Example 25 | COP1 | 8.7 | A301 | 2 | 11.2 | 2.5 | 2 | 1 | S | −129 nm |
| Example 26 | COP1 | 8.7 | A302 | 2 | 9.4 | 0.7 | 2 | 1 | S | −130 nm |
| Example 27 | COP1 | 8.7 | A303 | 2 | 11.3 | 2.6 | 2 | 1 | A | −128 nm |
| Example 28 | COP1 | 8.7 | A304 | 2 | 11.5 | 2.8 | 2 | 1 | A | −128 nm |
| Example 29 | COP1 | 8.7 | A305 | 2 | 10.1 | 1.4 | 2 | 1 | S | −131 nm |
| Example 30 | COP1 | 8.7 | A306 | 2 | 11.4 | 2.7 | 2 | 1 | A | −126 nm |
| Example 31 | COP1 | 8.7 | A307 | 2 | 10.5 | 1.8 | 2 | 1 | S | −131 nm |
| Comparative Example 1 | TAC1 | 16.4 | A301 | 2 | 11.2 | 5.2 | 2 | 1 | C | −62 nm |
| Comparative Example 2 | COP1 | 8.7 | A101 | 2 | 16.8 | 8.1 | 2 | 1 | C | −48 nm |
| Comparative Example 3 | TAC1 | 16.4 | A101 | 15 | 16.8 | 0.4 | 2 | 1 | C | −95 nm |
| Comparative Example 4 | TAC1 | 16.4 | A101 | 10 | 16.8 | 0.4 | 2 | 1 | B | −105 nm |
| Comparative Example 5 | COP1 | 8.7 | A302 | 10 | 9.4 | 0.7 | 2 | 1 | C | −77 nm |

*1Onium salt compound S01
*2Boronic acid compound S2

From the results shown in Table 2, it was found that in a case where a difference in δa value between the polymer compound and the substrate was more than 3, and in a case where the mixing amount of the polymer compound was large, since there were defects in alignment (vertical alignment), the area of the dark field was reduced in the observation with the polarizing microscope, and the development of the phase difference (Rth) in the oblique direction was also small (Comparative Examples 1 to 5).

In contrast, it was found that in a case where a difference in δa value between the polymer compound and the substrate was 3 or less and the mixing amount of the polymer compound was less than 10 parts by mass with respect to 100 parts by mass of the liquid crystal compound, since the dark field was observed over the almost whole area in the observation with the polarizing microscope, the alignment (vertical alignment) was excellent, and the phase difference (Rth) in the oblique direction was developed (Examples 1 to 31).

Particularly, from the results of Examples 25 to 31, it was found that in a case where a difference in δa value between the polymer compound and the substrate was 2.5 or less, the alignment was further improved.

EXPLANATION OF REFERENCES

1: substrate
2: phase difference layer
3: liquid crystal compound
4: polymer compound
10: optical film

What is claimed is:

1. An optical film comprising:
a substrate; and
a phase difference layer which is provided on the substrate to be adjacent to the substrate,
wherein the phase difference layer is a layer formed by fixing vertical alignment of a liquid crystal compound having a polymerizable group included in a liquid crystal composition containing the liquid crystal compound and a polymer compound,
a difference in δa value between the polymer compound and the substrate, which is calculated using three-dimensional SP values, is 3 or less,
a content of the polymer compound is less than 10 parts by mass with respect to 100 parts by mass of the liquid crystal compound,
wherein the polymer compound is a polymer having a repeating unit represented by Formula (I),

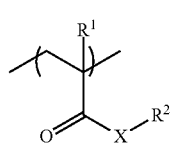

(I)

in Formula (I), $R^1$ represents a hydrogen atom or a methyl group; X represents —O— or —NH—; and $R^2$ represents a hydrogen atom or an organic group; the organic group includes a hydrophilic group, and the hydrophilic group is a group selected from the group consisting of a hydroxy group, a carboxy group, an amino group, a sulfo group, a sulfate group, a phosphonoxy group, and salts thereof, and wherein the polymer compound does not have a fluorine atom.

2. The optical film according to claim 1,
wherein an amount of the polymer compound present on a surface of the phase difference layer close to the substrate is larger than an amount of the polymer compound present on a surface of the phase difference layer opposite to the substrate.

3. The optical film according to claim 1,
wherein the polymer compound has a hydrophilic group.

4. The optical film according to claim 1,
wherein the polymer compound has a hydrophilic group, and
the liquid crystal composition contains an onium salt compound.

5. The optical film according to claim 1,
wherein the polymer compound has a hydrophilic group, and
the liquid crystal composition contains a boronic acid compound.

6. The optical film according to claim 1,
wherein a δa value of the substrate, which is calculated using three-dimensional SP values, is 10 or more.

7. The optical film according to claim 1,
wherein a δa value of the polymer compound, which is calculated using three-dimensional SP values, is 15 to 19.

8. The optical film according to claim 1,
wherein the polymer compound has a mesogen group represented by Formula (M),

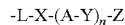

-L-X-(A-Y)$_n$-Z  (M)

here, L represents a linking group having 1 to 8 carbon atoms; X and Y each independently represent a single bond, —O—, —C(O)O—, —OC(O)—, —OC(O)O—, —C(O)OCH$_2$CH$_2$—, or —CH$_2$CH$_2$C(O)O—; A represents a 1,4-phenylene group, a 2,6-naphthylene group, or a 1,4-transcyclohexylene group which may have a substituent; Z represents a hydrogen atom, an alkyl group having 1 to 8 carbon atoms, an alkenyl group having 1 to 8 carbon atoms, a halogen atom, a cyano group, or -L$^1$-P, where L$^1$ represents a linking group having 1 to 8 carbon atoms, and P represents a polymerizable group; n represents an integer of 2 to 5; and in a case where n is an integer of 2 or greater, a plurality of A's may be the same or different from each other; and a plurality of Y's may be the same or different from each other.

9. The optical film according to claim 1,
wherein a δa value of the substrate, which is calculated using three-dimensional SP values, is 10 or more, and
the polymer compound is a polymer having a repeating unit having a δa value of 13 or more and less than 18, the δa value being calculated using three-dimensional SP values.

10. The optical film according to claim 1,
wherein a δa value of the substrate, which is calculated using three-dimensional SP values, is 5 or more and less than 10, and
the polymer compound is a polymer having a repeating unit having a δa value of 5 or more and less than 11, the δa value being calculated using three-dimensional SP values.

11. A polarizing plate comprising: the optical film according to claim 1.

12. A polarizing plate comprising: the optical film according to claim 8.

13. The polarizing plate according to claim 11, further comprising:
a polarizer.

14. The polarizing plate according to claim 12, further comprising:
a polarizer.

15. An image display device comprising:
the optical film according to claim 1.

16. An image display device comprising:
the optical film according to claim 8.

17. An image display device comprising:
the polarizing plate according to claim 12.

18. An image display device comprising:
the polarizing plate according to claim 14.

* * * * *